US009634185B2

(12) United States Patent
Bender et al.

(10) Patent No.: US 9,634,185 B2
(45) Date of Patent: Apr. 25, 2017

(54) OPTICAL SEMICONDUCTOR DEVICE AND METHOD FOR MAKING THE DEVICE (71) Applicant: IMEC VZW, Leuven (BE)

(72) Inventors: Hugo Bender, Edegem (BE); Yang Qiu, Leuven (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 0 days.

(21) Appl. No.: 15/076,427

(22) Filed: Mar. 21, 2016

(65) Prior Publication Data
US 2016/0284929 A1 Sep. 29, 2016

(30) Foreign Application Priority Data

Mar. 26, 2015 (EP) ..................................... 15160994

(51) Int. Cl.
H01L 33/18 (2010.01)
H01L 33/28 (2010.01)
H01L 33/00 (2010.01)
H01L 33/08 (2010.01)

(52) U.S. Cl.
CPC .......... H01L 33/18 (2013.01); H01L 33/0054 (2013.01); H01L 33/28 (2013.01); H01L 33/08 (2013.01)

(58) Field of Classification Search
CPC ............. H01L 29/785; H01L 29/66795; H01L 27/0886; H01L 21/823431; H01L 21/845; H01L 33/0054; H01L 33/28; H01L 33/18
See application file for complete search history.

(56) References Cited

U.S. PATENT DOCUMENTS

| 9,349,658 | B1* | 5/2016 | Jacob | H01L 21/845 |
| 2007/0205421 | A1* | 9/2007 | Mathew | B82Y 20/00 257/80 |
| 2010/0176375 | A1* | 7/2010 | Lochtefeld | H01L 33/06 257/14 |
| 2013/0168725 | A1 | 7/2013 | Guillemoles et al. | |
| 2014/0159171 | A1* | 6/2014 | Cai | H01L 29/785 257/412 |
| 2015/0017774 | A1* | 1/2015 | Tong | H01L 21/02057 438/283 |

(Continued)

OTHER PUBLICATIONS

Kim et al., "Hexagonal silicon formation by pulsed laser beam annealing", Materials Letters 27 (1996) 275-279.

(Continued)

Primary Examiner — Marvin Payen
Assistant Examiner — Jeremy Joy
(74) Attorney, Agent, or Firm — Knobbe Martens Olson & Bear, LLP (57) ABSTRACT An optical semiconductor device comprises, on a substrate, a fin of diamond-cubic semiconductor material and, at the base of the fin, a slab of that semiconductor material, in a diamond-hexagonal structure, that extends over the full width of the fin, the slab being configured as an optically active material. This semiconductor material can contain silicon. A method for manufacturing the optical semiconductor device comprises annealing the sidewalls of the fin, thereby inducing a stress gradient along the width of the fin.

9 Claims, 5 Drawing Sheets (56) References Cited

U.S. PATENT DOCUMENTS

2016/0056244 A1* 2/2016 Dasgupta ............ H01L 29/0649
  257/183
2016/0071956 A1* 3/2016 Balakrishnan .... H01L 29/66818
  257/401

OTHER PUBLICATIONS

Fissel et al., "Formation of twinning-superlattice regions by artificial stacking of Si layers", Journal of Crystal Growth 290 (2006) 392-397.
Fissel et al., "Epitaxial growth of non-cubic silicon", Microelectronics Journal 36 (2005) 506-509.
Zhang et al., "Stable hexagonal-wurtzite silicon phase by laser ablation", Applied Physics Letters 75, 2758 (1999); doi: 10.1063/1.125140.
Fabbri et al., "Visible and Infra-red Light Emission in Boron-Doped Wurtzite Silicon Nanowires", Scientific Reports, 4 : 3603, DOI: 10.1038/srep03603, Published Jan. 8, 2014.

* cited by examiner

OPTICAL SEMICONDUCTOR DEVICE AND METHOD FOR MAKING THE DEVICE

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 15160994.8 filed Mar. 26, 2015. The aforementioned application is incorporated by reference herein in its entirety, and is hereby expressly made a part of this specification.

FIELD OF THE DISCLOSURE

The present disclosure generally relates to an optical semiconductor device and a method for making such optical semiconductor device.

BACKGROUND OF THE DISCLOSURE

Silicon (Si) normally crystallizes in the diamond cubic (dc) structure, which corresponds to the zinc-blende structure with single atom type. The cubic Si has an emission around 1.1 eV corresponding to an indirect band gap with low intensity radiation. Therefore it is not a material of interest for optoelectronic applications, but it is mainly used as the substrate for microelectronic devices and for solar cells. However, there are at least 13 phases of silicon reported, most of which only form under high pressure conditions and are otherwise unstable. The existence of Si in different crystal structures with different electronic properties could offer the possibility of increased flexibility in the design of future Si-based devices. Among them, hexagonal silicon with lonsdaleite structure, which corresponds to the wurtzite structure with single atom type, and which is also referred to as diamond-hexagonal (dh) Si, Si IV (A) or 2H Si, attracted lot of attention during the last decade. In 2002, Raffy et al. predicted in "Properties of hexagonal polytypes of group-IV elements from first-principles calculations" in Phys. Rev. B. 66, 075201 (2002) that for Si the fundamental energy gap decreases with increasing hexagonality of the polytype.

SUMMARY OF THE DISCLOSURE

It is an object of embodiments of the present disclosure to provide an optical semiconductor device compatible with sub-14 nanometer semiconductor technology.

The above objective is accomplished by an optical semiconductor device and method for manufacturing a semiconductor device according to the present disclosure.

In a first aspect, a method for manufacturing an optical semiconductor device is disclosed, the method comprising: providing a substrate comprising a layer of diamond-cubic semiconductor material; patterning the diamond-cubic semiconductor layer to form a fin being sandwiched between a first confined space and a second confined space, the first confined space adjacent to a first major sidewall of the fin and the second confined space adjacent to a second major sidewall of the fin; the first and second confined space comprising an oxide material in contact with the major sidewalls; and, annealing the device thereby forming at the base of the fin and across the full width of the fin a slab of the semiconductor material in a diamond-hexagonal structure.

By annealing the device, a first mechanical stress is induced in the first confined space and a second mechanical stress in the second confined space, wherein the first mechanical stress is different from the second mechanical stress, thereby thus inducing a stress gradient over the (width of the) fin.

The slab of diamond-hexagonal semiconductor material formed during the manufacturing process is an optical active material. During the annealing step of the device, the major sidewalls of the fin are oxidized and the diamond-cubic semiconductor material at the base of the fin is transformed (phase transformation) into diamond-hexagonal semiconductor material.

It is an advantage of certain embodiments that an optical semiconductor device is formed which is stable during further processing steps, including steps at high temperature (higher than 1100 degrees Celsius).

It is an advantage of certain embodiments that an optical semiconductor device is formed using standard semiconductor processing steps.

It is an advantage of certain embodiments an optical semiconductor device may be embedded in the active region together with other semiconductor devices. The optical semiconductor device is formed at the base of the fin, whereas other semiconductor devices, such as logic or memory devices, are formed at the top of the fin.

According to embodiments the first confined space is smaller than the second confined space. Due to the different width of the first and the second confined space the stress in the first confined space is larger than the stress in the second confined space, whereby a stress gradient can be induced over the fin of the device.

The width of the confined spaces before and after the annealing step is different, more specifically the width of the confined spaces will become larger after annealing.

According to embodiments at least one of the first and second confined space is confined by the fin and another fin. So the fin is sandwiched between two confined spaces. A confined space may be sandwiched in between a fin and another fin. The space width of the confined space is thereby determined by the distance between a major sidewall of the fin and a major sidewall of the another fin. The width of the fin is defined by the distance between the two confined spaces which is between the first major sidewall of the fin and the second major sidewall of the fin. The first and second major sidewall are opposite to each other.

According to embodiments the another fin is patterned (and thus also annealed) together with the fin. Thus the fin and the another fin are patterned simultaneously and are annealed simultaneously.

According to embodiments an array of fins may thus be patterned in the diamond-cubic semiconductor material of the optical semiconductor device. The array of fins comprises a set of fins parallel to one another with a confined space in between each fin. So along the array of fins the width in between the fins increases from 8 nm to 16 nm to 24 nm etc.

It is an advantage that a gradual increasing spacing between the fins may be manufactured using standard lithographic techniques such as double patterning lithography or extreme ultraviolet (EUV) lithography.

According to embodiments the width between the fins of the array of fins is different. Otherwise said: the confined spaces between the fins have different width. The spacing between the fins may be gradually increasing along the array. The spacing may gradually increase with at least 8 nm from one fin to the next fin.

According to embodiments the width of the first and/or second confined spaces is preferably smaller than 50 nm.

It is an advantage of embodiments that in an array of fins a series of parallel slabs of diamond-hexagonal material may be formed simultaneously.

According to embodiments, annealing the device comprises oxidizing the first and the second major sidewall of the fin. Preferably wet oxidation is used.

The wet oxidation may be at 750 degrees Celsius for 30 minutes. If a lower temperature is used, a longer oxidation time is needed. So alternatively 650 degrees Celsius is also possible but for about 250 minutes. Alternatively 700 degrees Celsius is also possible but for about 90 minutes. The oxidation parameters are selected to grow an oxide of the semiconductor material at the fin sidewalls whereby a stress gradient over the fin is created causing the phase conversion of the semiconductor material.

Alternatively dry oxidation may be used; however the oxidation parameters will differ from wet oxidation. Dry oxidation is slower than wet oxidation and thus needs longer time. The oxidation parameters are selected to have an oxide at the first and second major sidewalls of the fin to induce a stress in the device causing the phase transformation of the semiconductor material.

It is an advantage of certain embodiments that dc-Si to dh-Si phase transformation occurs at the bottom of the fin over the full width of the fin.

It is an advantage of certain embodiments that dc-Si to dh-Si phase transformation occurs in a controlled way.

According to embodiments the first confined space may be covered with a capping layer, the capping layer being a diffusion barrier for oxygen. A stress gradient is induced over the fin, i.e. a first stress in the first confined space which is different from a second stress in the second confined space. This difference in stress (i.e. stress gradient) may be induced by using different widths for the confined spaces. Another possibility is a fin having confined spaces with the same width at both sides, but further comprising a capping layer on top of one of the first or the second confined space.

According to embodiments the capping layer comprises SiN.

According to embodiments the semiconductor material is chosen from Si or $Si_xGe_{1-x}$ with $0<x<1$.

A III-V material could also be used as for the fin semiconductor material as it may have a comparable phase transformation from sphalerite to wurtzite phase.

According to embodiments the fin is tapered fin.

According to embodiments the width at the base of the fin is preferably smaller than 50 nm, more preferably smaller than 25 nm.

According to a second aspect an optical semiconductor device is disclosed comprising a fin of diamond-cubic semiconductor material on a substrate and at the base of the fin a slab of the semiconductor material in a diamond-hexagonal structure across the full width of the fin. The diamond-hexagonal semiconductor slab is an optically active material.

According to embodiments the optical semiconductor device may further comprise optical contacts to the slab.

According to embodiments the semiconductor material is Si or $Si_xGe_{1-x}$ with $0<x<1$ According to embodiments the fin of the optical semiconductor device is sandwiched in between a first and a second confined space, the first confined space being smaller than the second confined space.

According to embodiments the fin comprises adjacent to the slab a step at the side of the first confined space and a bulge at the side of the second confined space. The bulge is inclined upwards (and away from the substrate) by 15 to 20 degrees.

According to embodiments the slab has a thickness in the range of 2 to 50 nm.

According to embodiments the optical semiconductor device comprises an array of fins of diamond-cubic semiconductor material and wherein at least two fins of the array of fins have a slab of the semiconductor material in a diamond-hexagonal structure across the full width of the fin. The spacing between the fins of the array may gradually increase.

It is an advantage of certain embodiments that the semiconductor optical device and the method for manufacturing the semiconductor optical device are compatible with sub-14 nanometer semiconductor technology.

It is an advantage of certain embodiments that the method for manufacturing the semiconductor optical device is compatible with standard semiconductor process steps and device technology.

It is an advantage of certain embodiments that a semiconductor optical device for optoelectronic application may be integrated easily in standard Si-based device technologies.

It is an advantage of certain embodiments that the semiconductor optical device is stable and the optical active material formed during manufacturing is unaffected by subsequent high temperature process steps including implantation anneal, epitaxial growth and metallization step (i.e. temperatures higher than the temperature used during the annealing of the fin to induce a phase transformation).

It is an advantage of certain embodiments that a semiconductor optical device may be formed at well-defined positions.

BRIEF DESCRIPTION OF THE DRAWINGS

All drawings are intended to illustrate some aspects and embodiments of the present disclosure. The drawings described are only schematic and are non-limiting.

FIG. 3B shows a zoom of left part of four fins shown in FIG. 3A.

FIGS. 3A-3C shows TEM picture of an array of fins manufactured according to embodiments.

DETAILED DESCRIPTION OF ILLUSTRATIVE EMBODIMENTS

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Figure 1A:
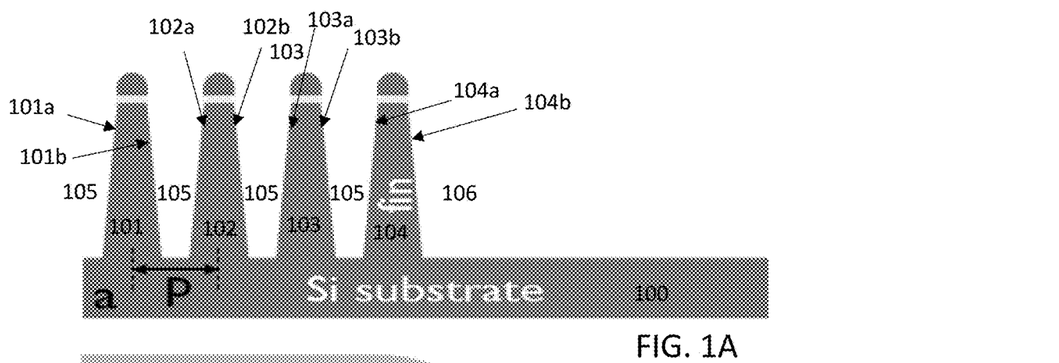
FIGS. 1A-1D show a schematic overview of processing steps for manufacturing an optical semiconductor device according to embodiments.
Figure 1B:
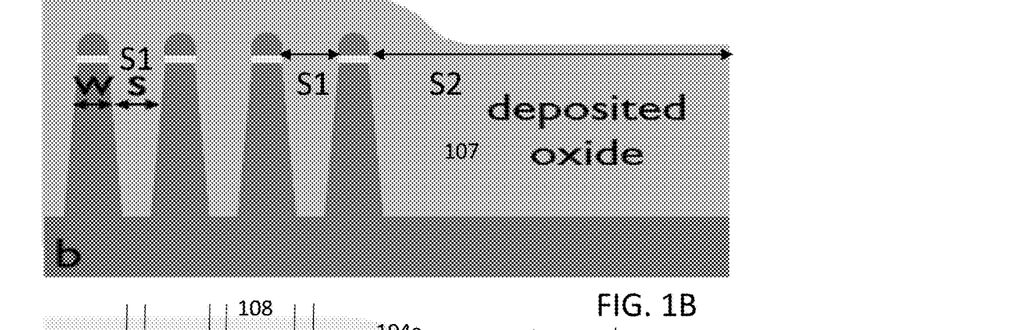
Figure 1C:
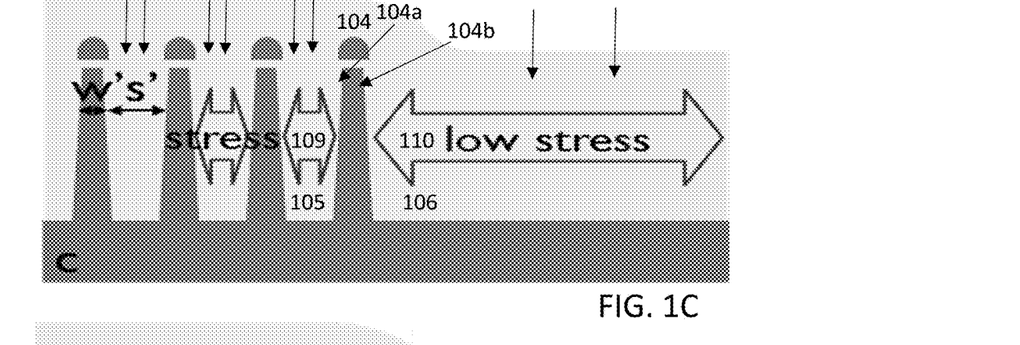

The important processing steps for the phase transformation in the base of the fin according to embodiments are schematically illustrated in FIGS. 1A-1D. Fins 101, 102, 103, 104 are patterned in a diamond-cubic semiconductor substrate material 100 thereby forming an array 110 of (as an example four) fins (FIG. 1A). Each fin has two major sidewalls 101a, 101b opposite to each other. Each fin 101, 102, 103, 104 is sandwiched in between two confined spaces 105, 106 more precisely a first confined space (left from one major sidewall 101a) and a second confined space 111b (right from the opposite major sidewall 101b).

According to embodiments the fins may be tapered. A fin is defined by a width, a length and a height, wherein the width and the length are parallel to the substrate and the height is perpendicular to the substrate. The bottom of base of the fin is part of the fin closest to the substrate. The top of the fin is at the opposite side of the bottom of the fin. The width at the top of the fin is shorter than the width at the bottom or base of the fin. The fins may be minimum tapered which means the width remains substantially equal along the height of the fin. So the width at the top and the bottom or base of the fin are substantially equal The distance between the fins 101, 102, 103, 104 is defined as the pitch P. So the width S of the confined spaces 105 is defined by the pitch P minus the width W of the fin.

According to embodiments the confined spaces may have equal width S.

According to embodiments the confined spaces may have a different width S1, S2.

The confined spaces 105, 106 may be confined by a neighboring fin. This means that a confined space is confined by a major sidewall of one fin and a major sidewall of the neighboring fin. The confined spaces 105, 106 may be confined by another confining wall, not forming part of a fin. The another confining wall may be for example a semiconductor wall at a distance of the fin.

Figure 2A:
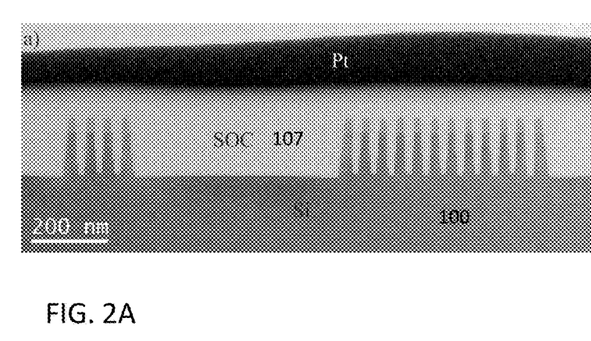
FIGS. 2A-2B shows TEM picture of an array of fins manufactured according to embodiments.
Figure 2B:
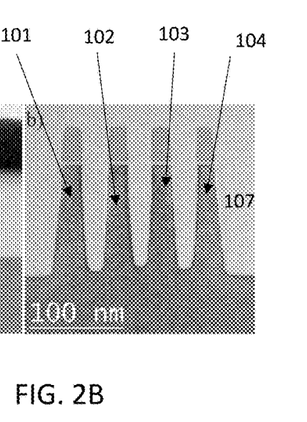

The confined spaces are filled with an oxide material 107 (FIG. 2B). More specifically the confined spaces are filled with a chemically deposited oxide material Next the patterned fins and confined spaces with oxide are oxidized 108. The oxidation step 108 induces stress in the device (the patterned fins and confined spaces with oxide).

The patterned fins and confined spaces are manufactured such that the stress in the confined spaces aside of a fin and at the major sidewalls is different. A first stress 109 in a first confined space 105 at the one major sidewall of the fin 104a is thus larger than a second mechanical stress 110 in the second confined space 106 at the opposite oxidized major sidewall 104b.

Figure 1D:
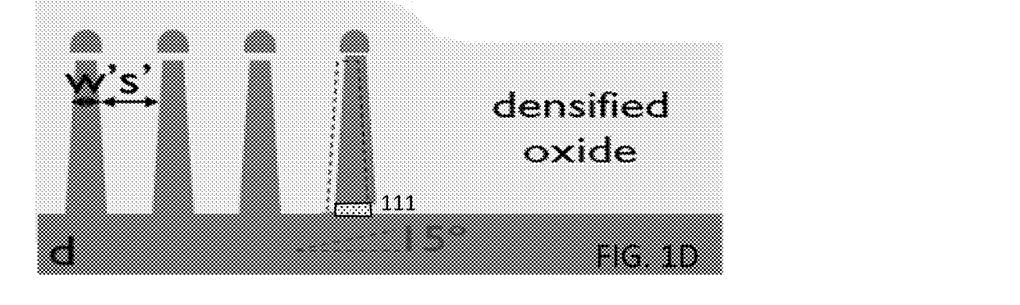

Due to the stress induced by the oxidation process in the system, the fin width W and space width S is changed to a width W' and space width S', which is visible by the shift of the fin compared to its initial position (dotted line). A slab 111 of diamond-hexagonal semiconductor material will be formed at the base of the fin (FIG. 1D). In the schematic example shown in FIG. 1D the change in width and space width is only visible for the outer fins 101, 104 as only for these fins a stress gradient is induced due to the difference in width of the first and second confined spaces. Between fins 102, 103 there is no stress gradient as the confined spaces on both sides of the fin are equal in width and thus the stress at both sides of the fins is equal thereby thus not inducing a stress gradient. For equally sized confined spaces (space width is equal) the stress gradient may however be induced by adding a capping layer on one of the confined spaces such that a stress gradient may be induced.

According to embodiments the semiconductor material is Si with a phase transformation from dc-Si to dh-Si. Another possible semiconductor material is $Si_xGe_{1-x}$, with $0<x<1$. To induce the phase transformation of $Si_xGe_1$, from diamond-cubic to diamond-hexagonal a Ge oxidation is needed to create sufficient stress to enable this phase transformation. Another possible semiconductor material is a III-V material which easily transforms from sphalerite to wurtzite phase.

A method based on advanced silicon device processing is discussed to form diamond-hexagonal silicon nano-ribbons. With an appropriate temperature anneal applied to densify the oxide fillings between silicon fins, the lateral outward stress exerted on fins sandwiched between wide and narrow oxide windows can result in a phase transition from diamond cubic to diamond-hexagonal Si at the base of these fins. The diamond-hexagonal slabs are generally 5-8 nm thick and can extend over the full width, optionally also over the length of the fins i.e. have a nano-ribbon shape along the fins. The hexagonal phase is epitaxial to the cubic structure with (01$\overline{1}$0)dh//(001)dc and [0001]dh//[110]dc. The interfaces are generally parallel to (001)dc or (115)dc. Although the hexagonal silicon is a metastable phase, once formed it is found to be stable during subsequent high temperature steps even during process steps up to 1050° C. As diamond-hexagonal silicon has a direct bandgap that emits light in visible range, the growth method has great potential for new generation optoelectronic devices.

Dh-silicon can emit visible light (direct transition at ~1.5 eV) with about two orders of magnitude higher efficiency than dc-Si as well as near-infrared light (indirect band gap at ~0.8 eV). dh-Si, with $P6_3/mmc$ symmetry, 4 atoms per primitive unit cell and approximate lattice parameter of a=b=0.38 nm and c=0.628 nm. This makes it useful for optical applications.

The crucial process steps that lead to the diamond-hexagonal silicon formation are schematically illustrated on FIGS. 1A-1D. After patterning of the fins, such as Si etch of the fin structures, the sidewalls have a smoothly varying profile and the silicon is defect free. The fin morphology is unchanged during the oxide fill step but gets modified during the subsequent wet oxygen anneal. Major change is an outward shift of the outer fins characterized by an increase of the width of the last spacing, the formation of a bulge on the outside and of a step on the silicon at the bottom of the outer spacing. In about 60% of the outer fins this goes together with formation of a hexagonal silicon slab over full or partial width of the fin. Most samples investigated are further cured in $N_2$ at higher temperature and got additional temperature budgets during the further processing of the devices. All these subsequent steps are found to have no impact on the presence or morphology of the hexagonal silicon. Hence the key process step that causes the phase transition to hexagonal silicon is the wet oxidation while the dh-phase is stable during further thermal steps. The wet oxidation simultaneously densifies the deposited oxide and oxidizes the sidewalls of the fins, i.e. the fin width w decreases and the spacing s increases with same amount. The conversion of Si to $SiO_2$ results in a volume expansion by a factor 2.2, i.e. $t_{ox}=2.2t_{si}$ with $t_{ox}$ the oxide thickness and $t_{si}$ the thickness of the consumed Si. The strain $\epsilon_{ox}$ in the oxide can be estimated from this volume expansion as $$\varepsilon ox = \frac{(s' - s'')}{s'}$$

with s' the physical width of the spacing after the oxidation, i.e. $s'=s+2\ t_{si}$, and $s''=s+2\ t_{ox}$, the oxide width that has to fit in the physical width s'. Based on Hooke's law for uniaxial load it allows to calculate the stress as $\sigma_{ox}=E\ \epsilon_{ox}$ with E the Young's modulus of the oxide. At the given oxidation temperature, it can be assumed that the oxide is not very viscous, i.e. is not pushed upwards out of the trench and the stress is horizontally exerted on the sidewalls of the fins (FIG. 2C). The fins are slightly tapered after the etch so that the initial spacing s varies from about 25 nm at the top to 10 nm at the bottom of the fin which leads for the applied oxidation conditions to a stress of 19 GPa to 35 GPa respectively. Part of the volume expansion will be compensated by the densification of the deposited oxide. If half of the expansion is accommodated by the densification, the stress will be reduced by nearly a factor two, and is therefore still considerable. For inner/dense fins the stress on both sides is similar. However, for the outer fins the stress on the inner side of the fin is much larger than on the outer side where the space to the next structures is in micrometer range and the estimated stress at that side remains below 1 GPa (FIG. 2C). Hence, the phase transformation and outwards shift of the outer fins can be related to the strain/stress from the unbalanced expansion during the wet oxidation step of the wide and narrow oxide windows next to the outer fins. Qualitatively this estimate shows that very high stress is involved and that it can be expected that the transformation will be initiated at the bottom where the stress is the largest. Once the transformation is finished and the fin shifted, the stress in the outer spacing will be released and no further modification will occur at the bottom of the fins during further processing steps. Moreover the high temperature $N_2$ anneal after the oxidation step will allow vertical viscous flow of the oxide so that a general stress reduction occurs.

The bulges and inner steps have similar sizes for all 3 major types of configurations at the bottom of the outer fins. The occurrence of similar fin shifts also without defects and with partial dh-Si slabs indicates that the partial dh-regions are not the nucleation state of the full dh-slabs. A transformation of mass from the inner side to the outer side of the fin could occur by dislocation nucleation at inner side, fast glide through the fin width and followed by annihilation of the dislocation at the outside. However the bulge should then be situated much higher so that the step to bulge plane would correspond to a $(111)_{dc}$ glide plane. Moreover such mechanism will not lead to dh-Si formation.

Transformation of dc- to dh-Si in indentations experiments is explained as a stress induced martensitic transformation involving shear at the intersection of the secondary twins which are generally present in high density in such indents. In our case, only single stacking faults are present at the edges of the dh-regions but never extensive twinning is observed at the bottom of the fins. Therefore such martensitic transformation mechanism seems less likely to explain the dh-Si formation. A model for direct transition of dc to dh-Si by application of high stress on the $(110)_{dc}$ plane involves bond breaking and the formation of new 6 atom rings which after relaxation result in dh-Si with the $(0001)_{dh}$ plane parallel $(110)_{dc}$. The transformation results in an 18% volume contraction in the $[110]_{dc}$ direction and equal expansion along $[001]_{dc}$ while no volume change occurs in the $[\bar{1}10]_{dc}$ direction. Such mechanism could explain the presence and size of the steps on the inner side of the spacing and the reduced width of the dh-Si slab compared to the dc-Si above and below. To explain the shift of the fin also in cases of partial or no dh-Si, a reverse transformation mechanism should occur once the stress is released so that the dc lattice is recovered. Although dh-Si is generally considered to be a metastable phase, the observed stability of the dh-Si slabs during further processing is in contradiction with such reverse transformation. An alternative process that overcomes this problem could be a dc- to dh-Si transformation that involves a cycle through several high pressure Si phases as observed in high pressure and indentation experiments. In such experiments an irreversible transition to β-tin Si (Si II) is observed for pressures above 12 GPa which is in the estimated pressure range at the bottom of the fins. The high pressure β-tin phase shows a 30% volume reduction per Si atom compared to dc-Si which can explain the formation of the step and reduction of the lateral width of the final dh-Si slab compared to the Si above and below. Upon unloading, the β-tin phase relaxes through a sequence of Si phases. The phase sequence for slow reduction of the stress involves Si II (tetragonal)→Si XII (rhombohedral)→Si III (bcc)→(Si XIII) and then coexistence of dh-Si (Si IV) and amorphous Si.

At the oxidation temperature used for the densification step of the oxide fill a thin region of amorphous Si confined between the dc-crystalline substrate and fin can easily epitaxially regrow. Therefore following such phase sequence the final state could be coexistence of dc- and dh-Si. The formation of either phase in the transition region might be favored by the local shape and interfaces of the intermediate phases. As these phases are metastable and quickly anneal out above 300° C., they will not be present anymore after the oxidation step and no direct evidence of this phase sequence is observed in our experiments. Nevertheless, such process can explain the presence of step/bulge with partial or no hexagonal silicon slab combined with stability of the hexagonal phase during further processing.

Most dh-Si slabs show a change of the interface with the dc silicon from inner to outer side of the fin. Whereas the $(001)_{dc}//(0\bar{1}10)_{dh}$ interface corresponds to the perfect alignment of $(1\bar{1}0)_{dc}$ with $(0001)_{dh}$, the $(115)_{dc}$ to $(03\bar{3}2)_{dh}$ interface implies a rotation over 3.5° as experimentally observed. Both interface structures can be modelled with 5 and 7 atom membered rings without any dangling bonds and show over a nearly 2 nm distance common lattice positions with only a small misfit (Table 1). However for the $(001)_{dc}//(0\bar{1}10)_{dh}$ interface the reshuffling of the bonds needs to be spread over 2 atomic planes resulting in a stepped dc/dh interface which will be less stable over longer distances. Steps at the interface may then result in a switch to the more easily formed $(115)_{dc}$ interface. Table 1 provides distances between coincident lattice positions in the dc to dh interface and lattice mismatch, calculated with dc: a=0.54282 nm-dh: a=0.3837 nm, c=0.6317 nm.

TABLE 1

| Interface dc//dh | Distance dc | nm | Distance dh | nm | Ratio dh/dc | Interface structure |
|---|---|---|---|---|---|---|
| (001)//(0-110) | 5/2 [110] | 1.8951 | 3 [0001] | 1.9192 | 0.9874 | 5 and 7 atomic rings in dual plane |
| (115)//(03-32) | 1/2 [552] | 1.9944 | [01-13] | 2.0083 | 1.0069 | 5 and 7 atomic rings in single plane |
| Both interfaces, distance along fin | 1/2 [1-10] | 0.3838 | 1/3 [2-1-10] | 0.3837 | 0.9997 | |

The formation of dh-Si requires sufficiently high stress to initiate the phase transformation and therefore does not occur for conditions that lead to lower stress, e.g. by applying less severe oxidation conditions (lower temperature, shorter oxidation time) or with larger initial spacing. As the dh-Si is situated at the base of the fins, it has no direct impact on the electronic properties of the devices that are processed on top of the fins and which only depend on the upper ~50 nm part of the fins. On the other hand by controlling the oxidation conditions and relative spacings on both sides of the fins, conditions that favor the dh-Si formation can be searched. As the position and crystallographic orientation of the resulting dh-Si are well controlled, this opens possibilities to combine in opto-electronic devices the optical properties of this phase with advanced FinFET based nano-electronic devices. For example, by gradually increasing the spacing between the fins one could generate a series of parallel dh-Si nano-ribbons which could be used as waveguides in the devices.

Experimental Results

Experiments have been performed. Fins with 45 nm pitch P are etched in (dc-)silicon. A nitride cap acts as hardmask during the Si etch. The spaces are filled with chemical vapor deposited (CVD) oxide which is subsequently densified by an oxidation step during which step the modification at the bottom of the outer fin happens. The schematic illustrates the edge of a dense group of fins.

The investigated FinFET structures are taken from a range of wafers processed up to different end-steps for process and device optimization. After the Si etch of the bulk fin structures the spaces are filled with a CVD oxide ($O_3$/TEOS). To density this oxide a wet oxidation anneal at 750° C. or a combination of wet oxidation anneal and high temperature (1050° C.) inert cure are applied. FIGS. 1A-1D presents a schematic drawing of the process steps involved relevant to this investigation. Self-aligned dual patterning lithography is used to obtain 14 nm fin dimensions with fin pitch of 45 nm. The investigated fin structures consist of groups of 4 fins and dense (10 or 12) fins with constant pitch as shown in FIG. 2A and FIG. 2B. Due to the etch, the sidewalls are sloped so that the spacing typically varies after etch from 25 nm at the top to 10 nm at the bottom. The groups of fins are separated by distances of more than 500 nm (FIG. 2A). The fins have lengths of 250 to 2500 nm and heights in the range 100-130 nm.

With Transmission Electron Microscopy (TEM) the fins are studied at different moments during the manufacturing method: after Si etching, after oxide fill and densification and after further processing steps of the device up to first level metallization (which is part of back-end-of-line BEOL processing).

FIGS. 2A-2B show bright field (BF) TEM images of a group of 12 and 4 fins after fin patterning (etching of the dc-Si material) (FIG. 2A) and the group of 4 fins at higher magnification (FIG. 2B). The confined spaces in between the fins are filled with Spin-on-Carbon (SOC) for the TEM specimen preparation. The nitride/oxide hardmask on the fins is used for the fin etching. The fins are well defined with a smooth profile at the base of their sidewalls. All fins show the nominal 45 nm pitch. Due to the etch step the outer fins are slightly asymmetric.

Figure 3A:
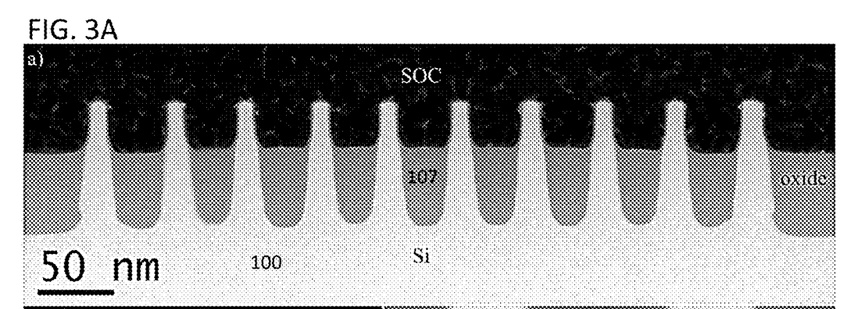
Figure 3B:
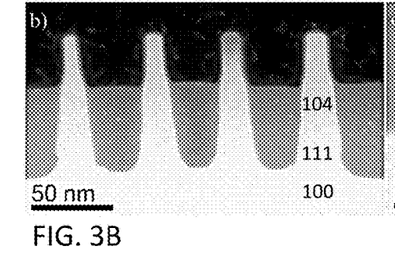
FIG. 3B shows a zoom of right part of four fins shown in FIG. 3A.
Figure 3C:
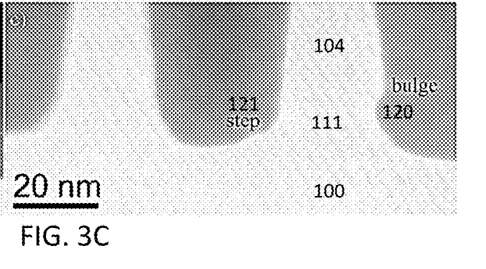
FIG. 3C shows a zoom of the outer right fin of FIG. 3A.

The morphology of the outer fins is modified after the oxide fill and densification as illustrated in FIGS. 3A-3C showing high-angle annular dark field scanning transmission electron microscopy (HAADF STEM) results after oxide fill and annealing (i.e., oxidation step, densification of the oxide in the confined spaces). In the group of 12 fins (FIG. 3A) and 4 fins (FIG. 3B) the outer fins are shifted outwards, i.e., the width of the confined spaces increased and steps 121 and bulges 120 are formed as illustrated in the zoom (FIG. 3C). These images are taken after further process steps where the nitride cap is removed and the oxide is recessed between the top of the fins. These steps have no effect on the modifications induced by the oxidation step.

In both dense and 4 fin groups, the outer spacings are enlarged and the outer fins moved outwards compared to the configuration after the etch. The width of the inner fins is slightly reduced by the oxidation but the profile at the bottom of the fins and the pitch are unchanged. The outer fins appear wider than the inner fins and have a typical bulge 120 at the outer bottom and a step 121 on the silicon on the inner side. The direction from step to bulge is nearly 16° inclined upwards to the outside of the group of fins, i.e. corresponds to a $\{115\}_{dc}$ plane. Step 121 and bulge 120 have similar widths and indicate an outward shift of the fin along this plane.

Figure 4A:
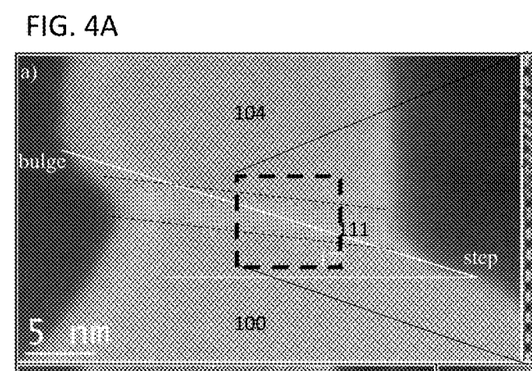
FIGS. 4A-4D shows TEM picture of an optical semiconductor device manufactured according to embodiments.
Figure 4B:
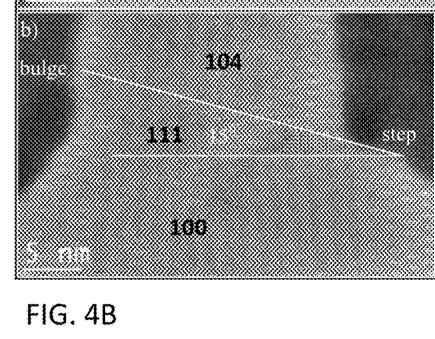
Figure 4C:
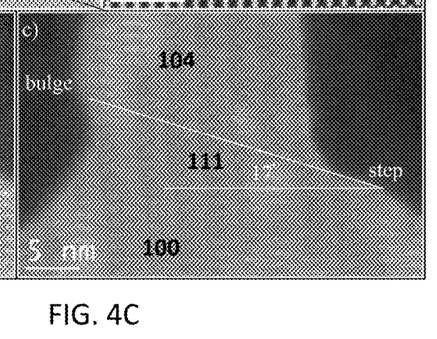
Figure 4D:
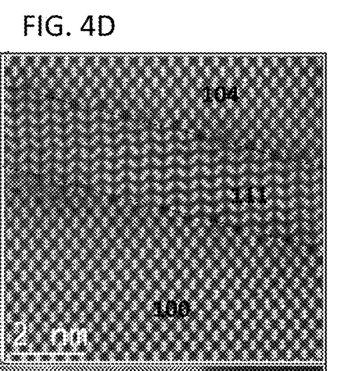

A zoom at the bottom of the outer fins after oxidation and annealing, shows 4 possible configurations which occur in a ratio 45/15/30/10 in the over 300 studied FinFET structures: a defect across the full fin width (FIG. 4A), a partial defect (FIG. 4B), no defect but bulge and step present with similar dimensions as for the defected cases (FIG. 4C), and rarely no defect and no clear bulge or step. The defects consist of a slab of material of different phase with a thickness of about 5 to 8 nm embedded between dc-Si. The full defects run from the step to a position below the bulge as shown in FIG. 4A. The width of the defected region is narrower than the Si below and above (including the step and bulge respectively). FIG. 4D shows a high angle annular dark field high resolution scanning transmission electron microscopy (HAADF HR-STEM) image taken at 300 kV. The dumbbell structure which can be seen in the silicon substrate and fin, is also present inside the defect with similar brightness of the atomic columns, i.e. same composition, but different structural arrangement of the columns. The partial defects are always situated next to the step at the inner side of the outer fins as shown in FIG. 3B.

Figure 5A:
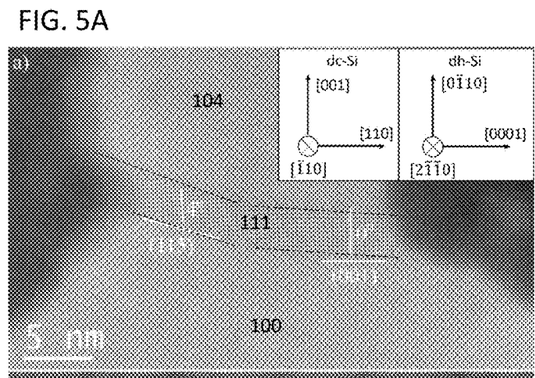
FIGS. 5A-5D shows TEM picture (FIG. 5A, FIG. 5B) and crystallographic picture (FIG. 5C, FIG. 5D) of an optical semiconductor device.
Figure 5B:
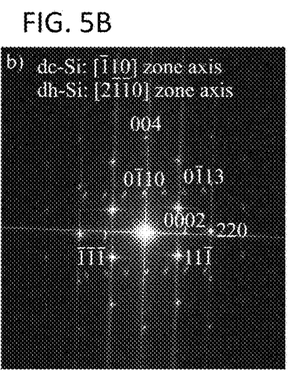
Figure 5C:
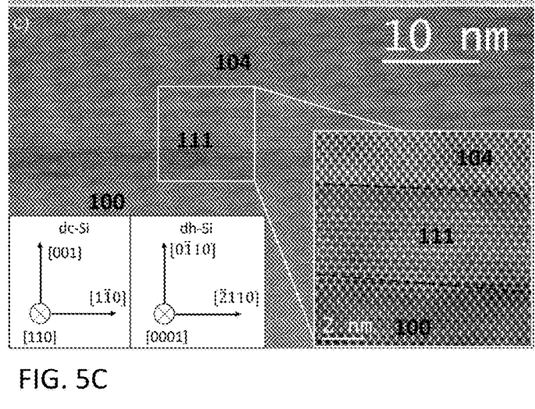
Figure 5D:
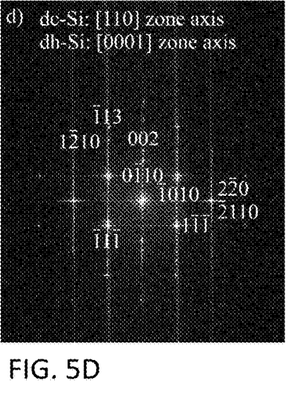

Detailed crystal structure analysis of the slab material is shown in FIG. 5A-5D. The atomically resolved HAADF STEM image along the fin direction (FIG. 5A) shows that the defect consists of a single crystalline material which is in epitaxial relationship to the dc-Si of substrate and fin. The crystal structure is analyzed from the Fourier transform (FFT) of the image (FIG. 5B). The crystallographic relationship between the dc-Si and dh-Si lattices as can be derived from the HR-STEM image (FIG. 5A) and the fast Fourier transform (FFT) of the image (FIG. 5B) is illustrated by the schematic in (FIG. 5A) and the indexing of the spots (FIG. 5B). The bottom image (FIG. 5C) shows a cut parallel with an outer fin with insert at bottom left of the lattice relationship and insert at bottom right presenting the dh-Si slab region at higher magnification, and the corresponding FFT with indexing of the spots (FIG. 5D).

The sharp bright spots in the FFT pattern (FIG. 5B) are due to the dc-Si of substrate and fin along $[\bar{1}10]$ zone axis. The streaked spots with lower intensity are from the slab material. The spots are doubled and elongated due to a rotation of the lattice in the left and right part of the defect. The reflections can be indexed as shown in FIG. 5B as diamond-hexagonal silicon observed along its $[2\bar{1}\bar{1}0]$ zone axis. The relationship between dc-Si and dh-Si can be summarized as $(001)_{dc}//(0\bar{1}10)_{dh}$, $[110]_{dc}//[0001]_{dh}$ and $[\bar{1}10]_{dc}//[2\bar{1}\bar{1}0]_{dh}$, which is the same epitaxial relation as observed for diamond-hexagonal silicon in indentation structures. The lattice parameters a and c are determined from the FFT pattern as 0.38 nm and 0.63 nm respectively with the ratio of c/a=1.65, i.e. very close to the ideal value for dh-Si as can be calculated based on the dc-Si parameters. The majority of the analyzed defects shows a stepped configuration as on FIG. 5A, i.e. part of the defect at the inner side of the fins show $(001)_{dc}$ interfaces and next part has sloped interfaces parallel $(115)_{dc}$. Some defects show additional steps between both kinds of interfaces, while only a few ones are observed that show almost exclusively the $(001)_{dc}$ interface. The lattice in the horizontal defect parts is exactly aligned with the above mentioned relationship, i.e. has $(110)_{dc}//(0001)_{dh}$, while a rotation of ~4° around $[2\bar{1}\bar{1}0]_{dh}$ is present in the defect regions with $(115)_{dc}$ interface plane. This rotation can be related to the different interface structure between the dc and dh lattices at both interfaces.

An atomically resolved HAADF STEM image at the slab area of the sample cut parallel with an outer Si fin is presented in FIG. 5C. The dh-Si ribbon is magnified further as insert at the bottom right. In the dc-Si of fin and substrate the typical dumbbell pattern is observed, while in the defect region clearly the regular hexagonal pattern corresponding to the dh-Si atomic columns along $[0001]_{dh}$ can be seen. The visibility of the latter pattern will only be ideal for defect parts that are observed exactly along the $[0001]_{dh}$ zone axis, and with the interface $(001)_{dc}//(0\bar{1}10)_{dh}$ extending on-edge through the full TEM specimen thickness. In view of the defect dimension and the step configuration, even in a very thin sample, this condition will only rarely be fulfilled. Superposition of dc and dh lattices in the viewing direction will result in vertical streaking of the atomic columns. In the inclined defect parts with $(115)_{dc}$ interfaces, this streaking will be further enhanced by the 4° rotation of the dh lattice. Therefore the clear visibility of the dh-lattice is limited to smaller areas along the defect. Observations at different positions along the length of the fin show that the dh-lattice can be recognized in regions with several hundred nanometer length, i.e. nano-ribbons of dh-Si are present at the base of the fins. The dh-regions are separated by parts of the fin that appear as dc-Si, which will correspond to the $3^{rd}$ (or $4^{th}$) kind of configuration as observed in the across fin views, i.e. step/bulge without defect. The relationship between dc-Si and dh-Si for the observation with the fin parallel with the image plane, is presented by the insert at the bottom left of FIG. 5C and the FFT shown in FIG. 5D. It fully agrees with the epitaxy derived from the cut perpendicular to the Si fins.

The combined information from both observation directions is fully conclusive for the dh-Si nature of the defect and excludes the possibility of presence of inclined twin defects.

Figure 6A:
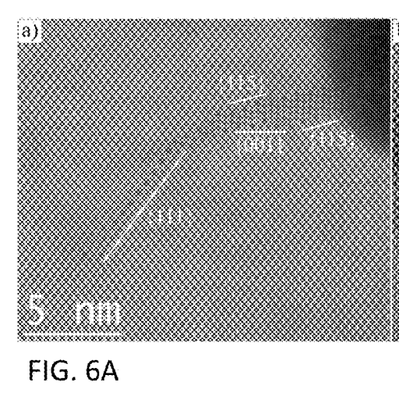
FIGS. 6A-6B shows TEM picture of a zoom of the slab from an optical semiconductor device according to embodiments.
Figure 6B:
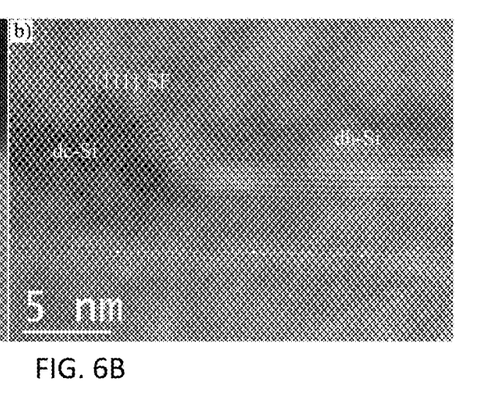

FIGS. 6A-B shows HR HAADF STEM images of dh-Si edges. The sample cut perpendicular to a fin with partial defect (FIG. 6A) and the sample cut parallel with the fins (FIG. 6B) show the presence of defects in $\{111\}_{dc}$ planes at the end of the dh regions. Many partial dh-Si regions show a planar defect at their ends in a $\{111\}_{dc}$ plane directed towards the silicon substrate (FIG. 6A). The lattice resolution is not always clear at these defects, but where interpretable they correspond to stacking faults. In TEM observation mode these defects are often strongly electron beam sensitive. Stacking faults bonded by a ⅙[112] Shockley partial are also present at the dc/dh transition of the fins observed parallel with the image plane (FIG. 6B).

All the TEM samples are prepared by focused ion beam (FIB, FEI Helios450HP) with the in-situ lift-out technique. To protect the sample surface during the ion milling a Spin-on-Carbon (SOC) layer is deposited on the full wafers or wafer pieces. This cap material fills high aspect ratio topography well and weakly planarizes the surface. The region of interest is further locally capped in the FIB with electron beam or ion beam deposited Pt. The major milling is done with 30 kV Ga ion beam while the milling progress is controlled with the scanning electron microscope. Final milling to minimize the damage layer on the specimens is performed with 5 kV Ga ion beam. The typical TEM specimen thickness is equal or less than 50 nm. Most samples are prepared across groups of 4 and 10 or 12 fins. In addition also TEM specimens are prepared parallel the fins so that only the outer fin of the groups is included in the TEM specimen.

Investigation by transmission electron microscope is performed with FEI Tecnai F30 or Titan 60-300 Cube in TEM or STEM imaging mode. The high resolution STEM images are acquired in the double corrected Titan system with the high-angle annular dark field (HAADF) detector generally at 120 kV, unless specified otherwise. This condition allows high resolution that resolves the Si-dumbbells without noticeable beam damage of the specimens. The images are acquired with a screen current of 0.1-0.2 nA, a convergence angle of 22 mrad and an inner collection angle of 50 mrad. HAADF contrast, also known as Z-contrast, can provide directly not only the location of the column of atoms but also information on the local composition at atomic scale. However, resolution can be further improved by using 300 kV.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for manufacturing an optical semiconductor device, comprising:

providing a substrate comprising a layer of semiconductor material, wherein the semiconductor material has a diamond-cubic structure;

patterning the layer of semiconductor material having the diamond-cubic structure to form a fin sandwiched between a first confined space and a second confined space, the first confined space being adjacent to a first major sidewall of the fin and the second confined space being adjacent to a second major sidewall of the fin, whereby the first confined space and the second confined space comprise an oxide material in contact with the first major sidewall and the second major sidewall, wherein the first confined space is smaller than the second confined space; and annealing the substrate, thereby forming at the base of the fin and across a full width of the fin a slab of semiconductor material having a diamond-hexagonal structure.

2. The method of claim 1, wherein at least one of the first confined space and the second confined space is confined by the fin and another major sidewall of another fin.

3. The method of claim 2, wherein the another fin is patterned together with the fin.

4. The method of claim 3, wherein a width of the confined spaces between fins gradually increases along an array of fins.

5. The method of claim 1, wherein annealing the substrate comprises oxidizing the first major sidewall and the second major sidewall.

6. The method of claim 5, wherein oxidizing comprises wet oxidation.

7. The method of claim 1, wherein the first confined space is covered with a capping layer, the capping layer configured as a diffusion barrier for oxygen.

8. The method of claim 1, wherein the semiconductor material is selected from the group consisting of Si and $Si_xGe_{1-x}$, wherein $0<x<1$.

9. The method of claim 1, wherein a width at the base of the fin is smaller than 50 nm.

* * * * *

UNITED STATES PATENT AND TRADEMARK OFFICE
CERTIFICATE OF CORRECTION

PATENT NO.        : 9,634,185 B2
APPLICATION NO.   : 15/076427
DATED             : April 25, 2017
INVENTOR(S)       : Hugo Bender It is certified that error appears in the above-identified patent and that said Letters Patent is hereby corrected as shown below:

In the Specification

Column 6 Line 27, Change "$Si_xGe_{1-x}$," to --$Si_xGe_{1-x}$--.

Column 6 Line 28, Change "$Si_xGe_1$," to --$Si_xGe_{1-x}$--.

Signed and Sealed this
Third Day of October, 2017

Joseph Matal
*Performing the Functions and Duties of the
Under Secretary of Commerce for Intellectual Property and
Director of the United States Patent and Trademark Office*